United States Patent
Appaswamy et al.

(10) Patent No.: US 9,881,913 B2
(45) Date of Patent: Jan. 30, 2018

(54) BIPOLAR SCR

(71) Applicant: Texas Instruments Incorporated, Dallas, TX (US)

(72) Inventors: Aravind C. Appaswamy, Plano, TX (US); Stanley Phillips, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/463,191

(22) Filed: Mar. 20, 2017

(65) Prior Publication Data

US 2017/0287896 A1    Oct. 5, 2017

Related U.S. Application Data

(63) Continuation of application No. 15/088,681, filed on Apr. 1, 2016, now Pat. No. 9,633,993.

(51) Int. Cl.
*H01L 29/747* (2006.01)
*H01L 27/02* (2006.01)
*H01L 29/08* (2006.01)
*H01L 29/10* (2006.01)
*H01L 29/417* (2006.01)
(Continued)

(52) U.S. Cl.
CPC ........ *H01L 27/0262* (2013.01); *H01L 23/535* (2013.01); *H01L 29/0649* (2013.01); *H01L 29/0834* (2013.01); *H01L 29/1012* (2013.01); *H01L 29/41716* (2013.01); *H01L 29/747* (2013.01)

(58) Field of Classification Search
CPC .............. H01L 23/535; H01L 27/0262; H01L 29/0649; H01L 29/083; H01L 29/0834; H01L 29/10; H01L 29/1012; H01L 29/1095; H01L 29/36; H01L 29/41716; H01L 29/747
See application file for complete search history.

(56) References Cited

U.S. PATENT DOCUMENTS 5,808,342 A    9/1998  Chen et al.
6,815,732 B1 *  11/2004  Vashchenko ...... H01L 29/66393
                                                257/107
(Continued)

OTHER PUBLICATIONS

PCT Search Report, dated Jul. 13, 2017, PCT/US2017025738.
(Continued)

*Primary Examiner* — Daniel Shook
(74) *Attorney, Agent, or Firm* — Jacqueline J. Garner; Charles A. Brill; Frank D. Cimino

(57) ABSTRACT

A high-voltage bipolar semiconductor controlled rectifier (SCR) includes an emitter region having a first polarity and overlying a base region having a second polarity different from the first polarity; a collector region having the first polarity and lying under the base region; an anode region having the second polarity; a first sinker region having the first polarity and contacting the collector region, wherein the anode region is between the first sinker region and the base region; and a second sinker region having the first polarity and contacting the collector region, the second sinker region lying between the anode region and the base region, wherein an extension of the anode region extends under a portion of the second sinker region.

20 Claims, 9 Drawing Sheets

(51) Int. Cl.
*H01L 23/535* (2006.01)
*H01L 29/06* (2006.01)

(56) References Cited

U.S. PATENT DOCUMENTS 7,309,905 B2   12/2007   Yu et al.
7,719,026 B2    5/2010   Lou et al.

OTHER PUBLICATIONS

Vashchenko, et al., "Bipolar SCR ESD devices", Microelectronics Reliability, vol. 45, p. 457-471, Jan. 11, 2005, Santa Clara, CA, USA.

* cited by examiner

BIPOLAR SCR

CROSS REFERENCE TO RELATED APPLICATIONS

This application is a continuation of U.S. Nonprovisional patent application Ser. No. 15/088,681, filed Apr. 1, 2016, the contents of which is herein incorporated by reference in its entirety.

FIELD OF THE DISCLOSURE

Disclosed embodiments relate generally to the field of integrated circuit designs. More particularly, and not by way of any limitation, disclosed embodiment are directed to methods for implementing a bipolar-based semiconductor controlled rectifier for an electrostatic discharge protection circuit.

BACKGROUND

Integrated circuits are quite susceptible to damage from electrostatic discharge from common environmental sources and can be destroyed when subjected to voltages higher than their intended voltage supply. Electrostatic discharge (ESD) protection circuits are used to discharge current from ESD events harmlessly, with silicon controlled rectifiers (SCR) providing an effective solution in a small area. However, issues remain in the design of SCRs for high-voltage pins. A solution is lacking with regard to a low-leakage, low-capacitance bipolar based SCR for high voltage pins. Non-SCR based solutions are inefficient, while existing SCR designs suffer from high leakage due to punch-through issues.

SUMMARY

The present patent application discloses an SCR that contains a blocking junction to prevent punch through. The blocking junction is constructed by modifying the collector sinker region and introducing anode junctions under the modified sinker to enable SCR action. The modified sinker can be used to change the trigger/holding current of the SCR and the construction allows for independent modification of the trigger current while maintaining the immunity to PNP injection from the substrate.

In one aspect, an embodiment of a high-voltage bipolar semiconductor controlled rectifier (SCR) is disclosed. The SCR includes an emitter region having a first polarity and overlying a base region having a second polarity different from the first polarity; a collector region having the first polarity and lying under the base region; an anode region having the second polarity; a first sinker region having the first polarity and contacting the collector region, wherein the anode region is between the first sinker region and the base region; and a second sinker region having the first polarity and contacting the collector region, the second sinker region lying between the anode region and the base region, wherein an extension of the anode region extends under a portion of the second sinker region.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 9:
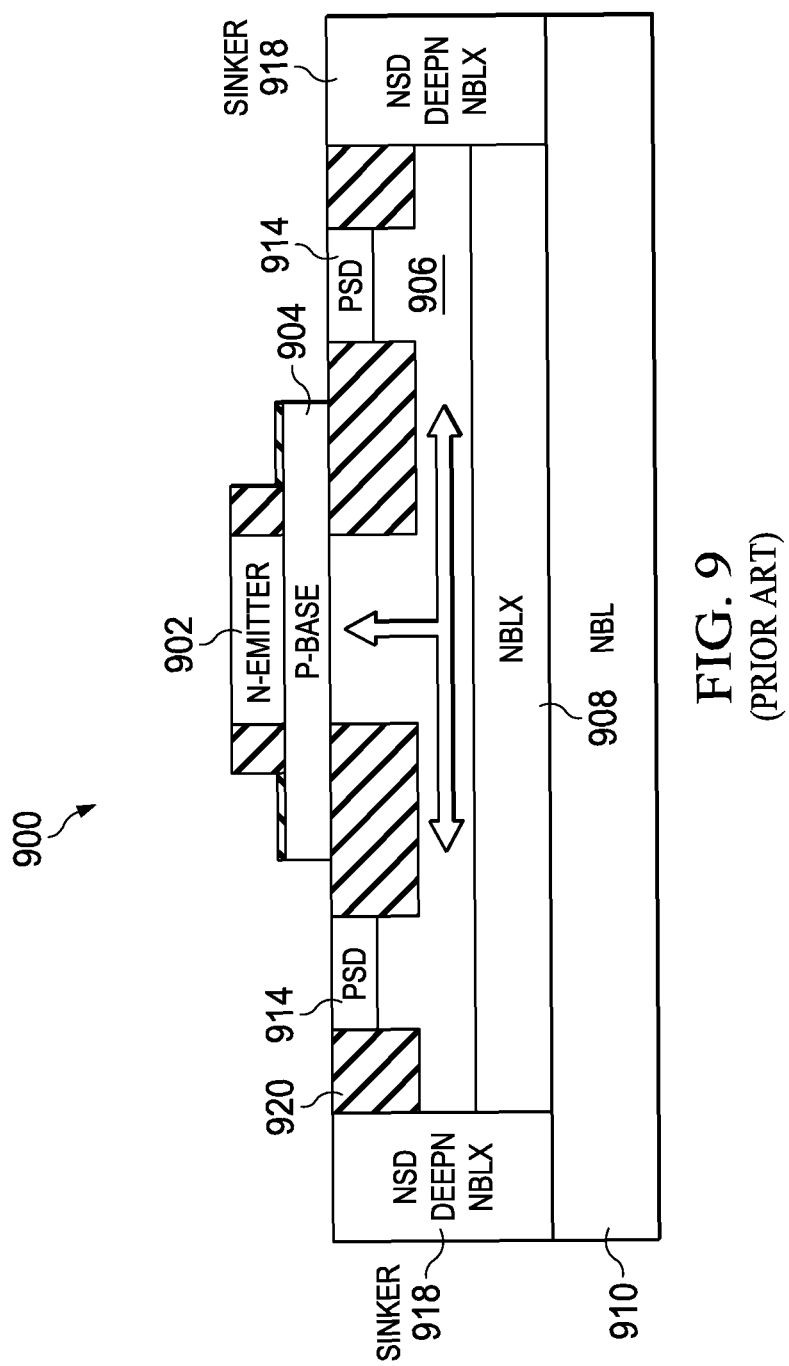
FIG. 9 depicts an example embodiment of a bipolar SCR as known in the art.

Referring now to the drawings and more particularly to FIG. 9, a cross-sectional view of a prior art SCR 900 is shown. SCR 900 is built on a bipolar transistor, i.e., the NPN transistor formed by n-type region N-Emitter 902, which is formed over p-type region P-Base 904 and an underlying n-type collector formed by Region 906, n-type buried layer extension (NBLX) 908 and n-type buried layer (NBL) 910. The collector is contacted by n-type Sinker 918, which is formed by three different implantations, referred to herein as n-type source/drain (NSD), n-type deep well (DEEPN) and NBLX. The cross-hatched areas represent Shallow Trench Isolation 920 or other dielectric layers. Since this example is an NPN transistor, a heavily doped p-type layer, here p-type source/drain (PSD) 914, is inserted into the NPN transistor to create a PNPN structure that acts as an SCR. SCR 900 works well at voltages in the range of 3-5 volts, but when higher voltages are used, multiple issues arise. One issue is punch-through; for example, whenever a reverse bias is applied from P-Base 904 to Region 906, the field can potentially go all the way to the anode, PSD 914, as shown by the arrows in this figure. This situation shorts out one of the internal bipolar transistors, giving a very leaky SCR at a very low voltage, so that SCR 900 can't hold high voltages at low current. Other issues can also arise, such as parasitic MOS transistors or charges on the shallow trench isolation that can cause a short, but basically, at a very low voltage, PSD 914, the anode for SCR 900, is soft-shorted to P-Base 904, which is part of the cathode, causing a high amount of leakage.

One way to avoid the leakage shown in FIG. 9 is to place PSD 914 on the outside of N-Sinker Region 918. In this configuration, however, the gain on the PNP portion of the SCR becomes very low, which does not allow proper SCR action.

Figure 1:
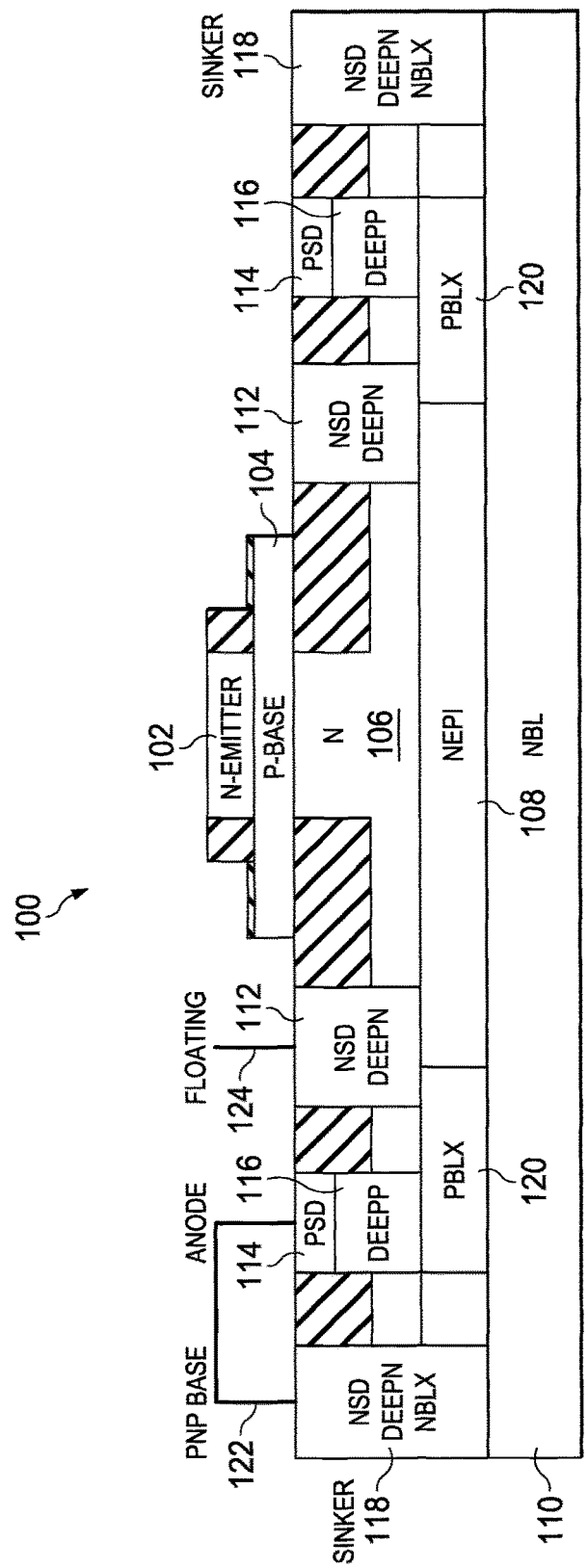
FIG. 1 depicts a cross-sectional view of an SCR according to an embodiment of the disclosure.

Referring next to FIG. 1, a cross sectional diagram of a first embodiment of a semiconductor controlled rectifier (SCR) 100 of the present invention is shown, having an increased immunity to the shorting effects discussed above. Here and in the following discussion, SCR refers to a semiconductor controlled rectifier rather than a silicon controlled rectifier, which is a special case of a semiconductor controlled rectifier. In general, reference to a semiconductor region as "heavily doped" means having a concentration of $10^{18}/cm^3$ or greater. Likewise, "lightly doped" means a semiconductor region having a concentration of less than $10^{18}/cm^3$. In both cases, the doped regions may be formed by ion implantation or other methods as are well known to those having ordinary skill in the art. Furthermore, the drawing figures are not to scale but are drawn to clearly illustrate important features of the present invention. In the following discussion, the term "electrically connected" means an ohmic current path exists between two or more cited elements and does not preclude the existence of resistors, parasitic elements, or other circuit elements within the current path as is well known in the art.

SCR 100 includes a p-type substrate (not specifically shown) and an n-type collector region that includes heavily doped n-type buried layer (NBL) 110, lightly-doped n-type epitaxial layer (NEPI) 108 and lightly doped Region 106. N-type buried layer (NBL) 110 is again contacted by n-type Sinker 118, which receives highly-doped implants NSD, DEEPN and NBLX. Heavily doped p-type region P-Base 104 overlies N-type Region 106 and heavily doped n-type region N-Emitter 102 overlies P-Base 104.

Heavily-doped p-type region PSD 114 is now isolated from n-type Region 106 by a secondary heavily doped n-type Sinker 112, which is placed between PSD 114 and P-Base 104 and receives implants NSD and DEEPN (but not the NBLX implant). Sinker 112 acts as a blocking junction for the leakage seen in the SCR of FIG. 9. Heavily doped p-type region PSD 114 is thus blocked from leakage by Sinker 112. In order to enable SCR action, two heavily-doped p-type regions, i.e., p-type deep well (DEEPP) 116 and p-type buried layer extension (PBLX) 120 provide an anode junction that extends partially under Sinker 112 to contact epitaxial layer NEPI 108. The presence of modified Sinker 112 and anode junction PBLX 120 relocates the current for SCR events deeper in the device. It is, of course, possible to have leakage between P-Base 104 and PBLX 120 in the current configuration, but this would occur at a higher voltage than the rated voltage of the inherent transistor, so this is not a great concern. Sinker Region 118 serves two purposes: it allows the SCR to be isolated from the substrate without needing deep trench isolation; and by having different resistance in series with Sinker 118 versus Sinker 112, the trigger voltage of the SCR is decoupled from the propensity of the SCR to inject current into the substrate.

In an example embodiment, typical doping used for each implant or layer in FIG. 1 can be as follows: N-Emitter is doped at between $5 \times 10^{19}/cm^3$ and $10^{20}/cm^3$; P-Base at between $5 \times 10^{17}/cm^3$ and $10^{19}/cm^3$; NEPI at between $5 \times 10^{15}/cm^3$ and $10^{17}/cm^3$; NBL at about $10^{19}/cm^3$; NSD at about $10^{20}/cm^3$; DEEPN at between $5 \times 10^{18}/cm^3$ and $10^{19}/cm^3$; NBLX at about $10^{18}/cm^3$ or greater; PSD at about $10^{20}/cm^3$; DEEPP at between $10^{18}/cm^3$ and $10^{19}/cm^3$; PBLX at between $10^{18}/cm^3$ and $10^{19}/cm^3$; and Region 106 at about $10^{15}/cm^3$. Applicant notes, however, that the DEEPN implant used in Sinker 112 does not need to be as heavily doped as noted to serve as a blocking junction; an implant in the range between $10^{16}/cm^3$ and $10^{18}/cm^3$ would also work.

Figure 2:
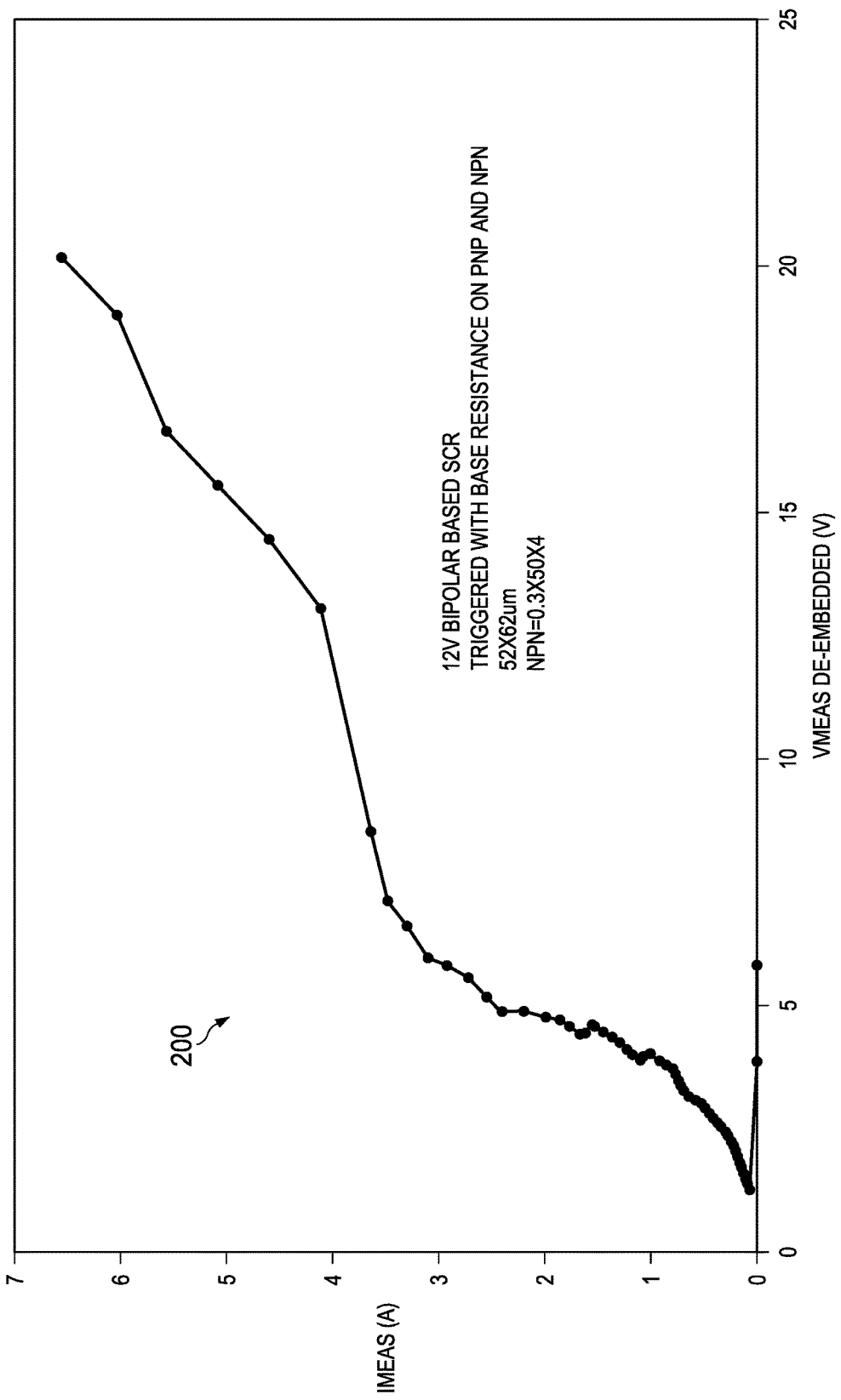
FIG. 2 depicts a current-voltage diagram of the SCR of FIG. 1.

SCRs are typically connected as shown in FIG. 1, where a metallization layer forms Connector 122 that connects Sinker 118 (which forms the base of an inherent PNP transistor) to PSD 114 (which forms the anode of the SCR). Sinker 118 and PSD 114 can be connected directly, as illustrated, or through a resistor (not specifically shown). The resistor or lack thereof determines how much the inherent PNP transistor turns on. Connection 124 to Sinker 112 is generally left floating to cause any current to come from the p-type regions. When SCR 100 is turned on, i.e., during an ESD event, current flows from PSD Region 114 through NEPI 108 and N-type Region 106 to P-Base 104 and then to N-Emitter 102. The disclosed SCR may provide one or more of the following benefits: the SCR is isolated; the design can allow independent control of trigger current and the amount of PNP injection from the substrate (as will be discussed below); the production of the SCR does not require the use of any additional masks; leakage issues are avoided; and the base bipolar on which he SCR is built is maintained, allowing for the same breakdown voltage FIG. 2 depicts a current-voltage diagram 200 of the SCR of FIG. 1, with the horizontal axis showing the voltage and the vertical axis identifying the current across the SCR. A 100 nanosecond Transmission Line Pulse (TLP) is provided to SCR 100 and the I-V characteristics are measured. As shown, the voltage rises to approximately 6-7 volts with very little current, then snaps back as the SCR is triggered. At that point, the SCR goes into action and takes large amounts of current away from the protected circuits.

Figure 3:
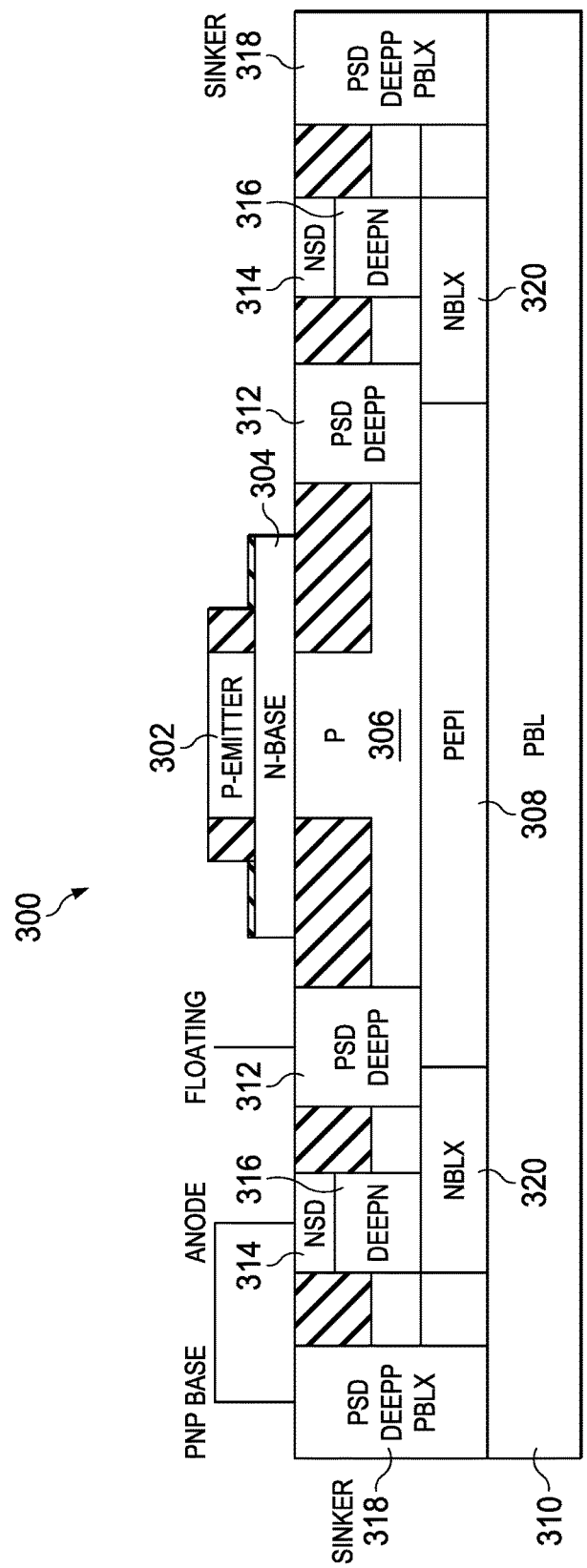
FIG. 3 depicts a cross-sectional view of an SCR according to an embodiment of the disclosure.

The SCR of FIG. 1 can also be implemented with the dopant types being reversed, i.e., with n-type dopants interchanged with p-type dopants and vice versa, as shown in FIG. 3. SCR 300 includes an n-type substrate (not specifically shown) and a p-type collector region that includes heavily doped buried layer PBL 310, lightly-doped epitaxial layer PEPI 308 and lightly doped Region 306. Buried layer PBL 310 is contacted by p-type Sinker 318, which receives highly-doped implants PSD, DEEPP and PBLX. Heavily doped n-type region N-Base 304 overlies p-type Region 306 and heavily doped p-type region P-Emitter 302 overlies N-Base 304.

Heavily-doped n-type region NSD 314 is now isolated from p-type Region 306 by secondary heavily doped p-type Sinker 312, which is placed between NSD 314 and N-Base 304 and receives implants PSD and DEEPP (but not the PBLX implant). Sinker 312 acts as a blocking junction for the leakage seen in the SCR of FIG. 9. Heavily doped N-type region NSD 314 is thus blocked from leakage by Sinker 312. In order to enable SCR action, heavily-doped n-type regions DEEPN 316 and NBLX 320 provide an anode junction that extends partially under Sinker 312 to contact epitaxial layer PEPI 308. The presence of modified Sinker 312 and anode junction NBLX 320 relocates the current for SCR events deeper in the device. As noted earlier, it is possible to have leakage between N-Base 304 and NBLX 320 in the current configuration, but this would occur at a higher voltage than the rated voltage of the inherent transistor.

Figure 4:
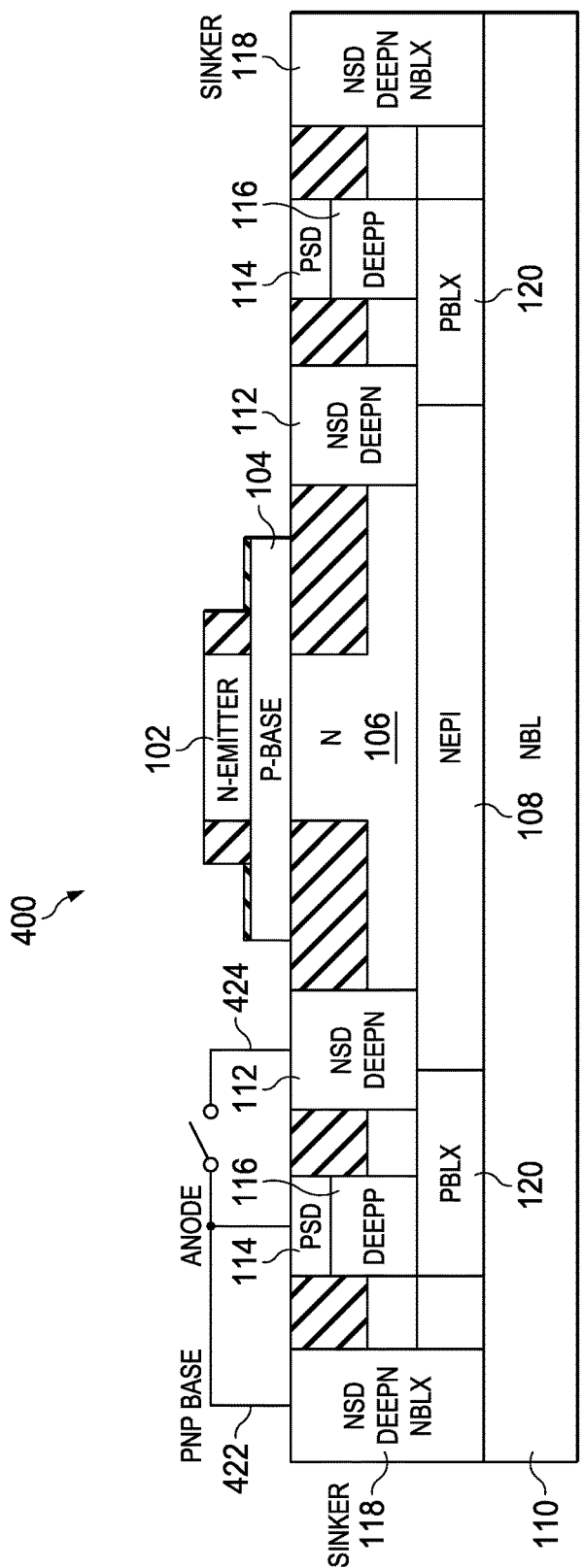
FIG. 4 depicts a cross-sectional view of an SCR according to an embodiment of the disclosure.

A variation on the connections in the disclosed embodiment is shown as SCR 400 in FIG. 4. In FIG. 1, Connector 124 was left floating; however in this embodiment, Connector 424 is switchably connected to Connector 422, e.g., through a MOSFET (not specifically shown). It will be remembered that, as seen in FIG. 2, an embodiment of SCR 100 has a trigger voltage of about 6-7 volts. However, if this SCR is used in a system having a normal operating voltage of, for example, 15 volt, the SCR will trigger at an undesirably low voltage. The disclosed switch between Connections 422 and 424 provides a way to modify the holding or trigger current, allowing SCR 400 to be used in higher-voltage situations. In normal operation, when the anode PSD 414 and extensions DEEPP 116 and PBLX 120, inject carriers that reach P-Base 104, NEPI 108 injects additional carriers. However, if the switch between Terminals 422 and 424 is closed, some of the carriers are "stolen" by Sinker 112 and do not contribute to the SCR action. Accordingly, when the switch is closed, the trigger voltage shown in FIG. 2 can be stretched to something nearer to 30 volts, for example. The switch is designed to be closed during normal operation of the circuit, but to open during ESD events. It will be understood that although the doping of FIG. 4 is shown as corresponding to the doping of FIG. 1, the switchable connection between Terminals 422 and 424 can also be used with the doping profile of FIG. 3 or with any of the embodiments disclosed herein.

Figure 5:
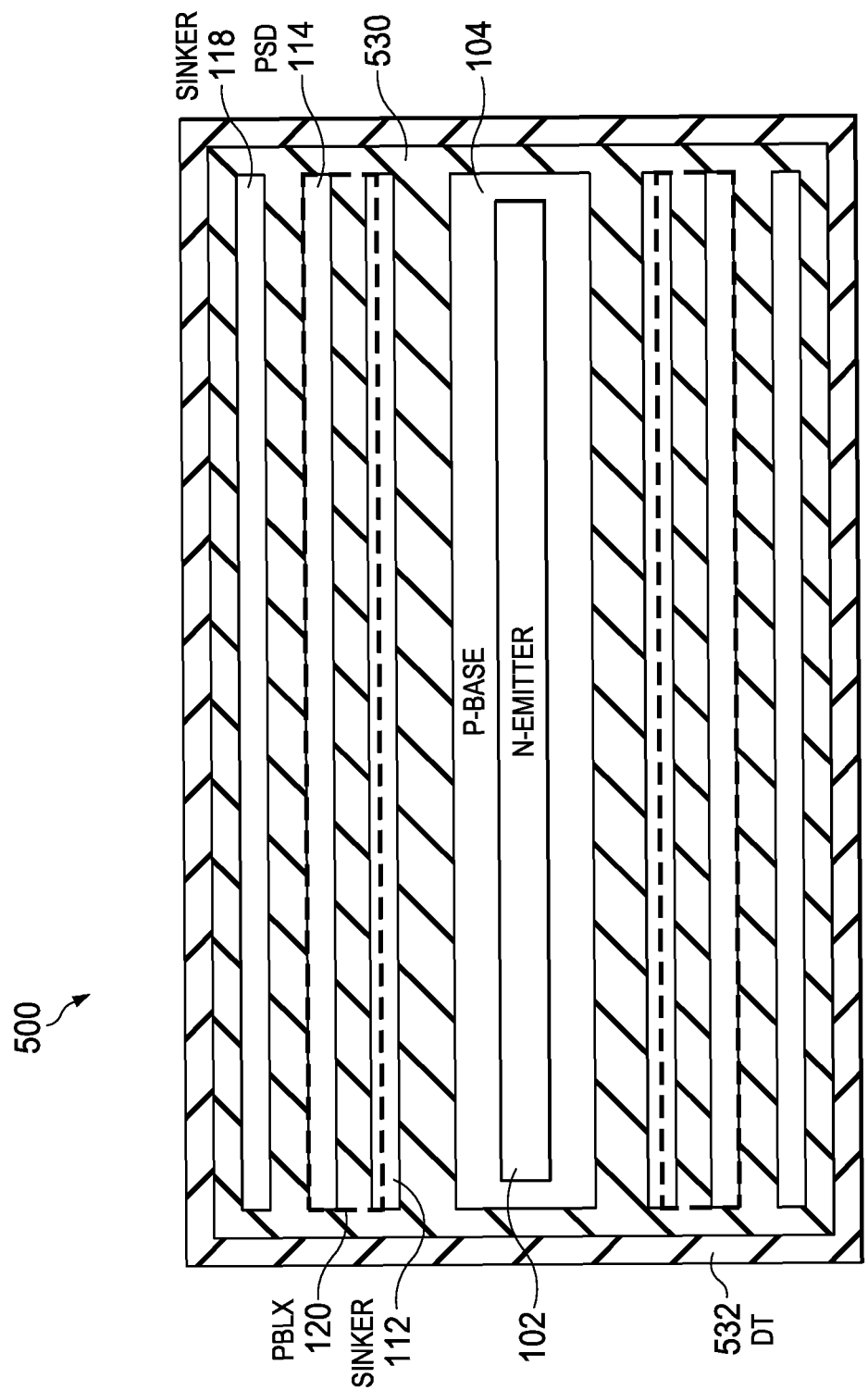
FIG. 5 depicts a plan view of the SCR of FIG. 1 according to an embodiment of the disclosure.
Figure 6:
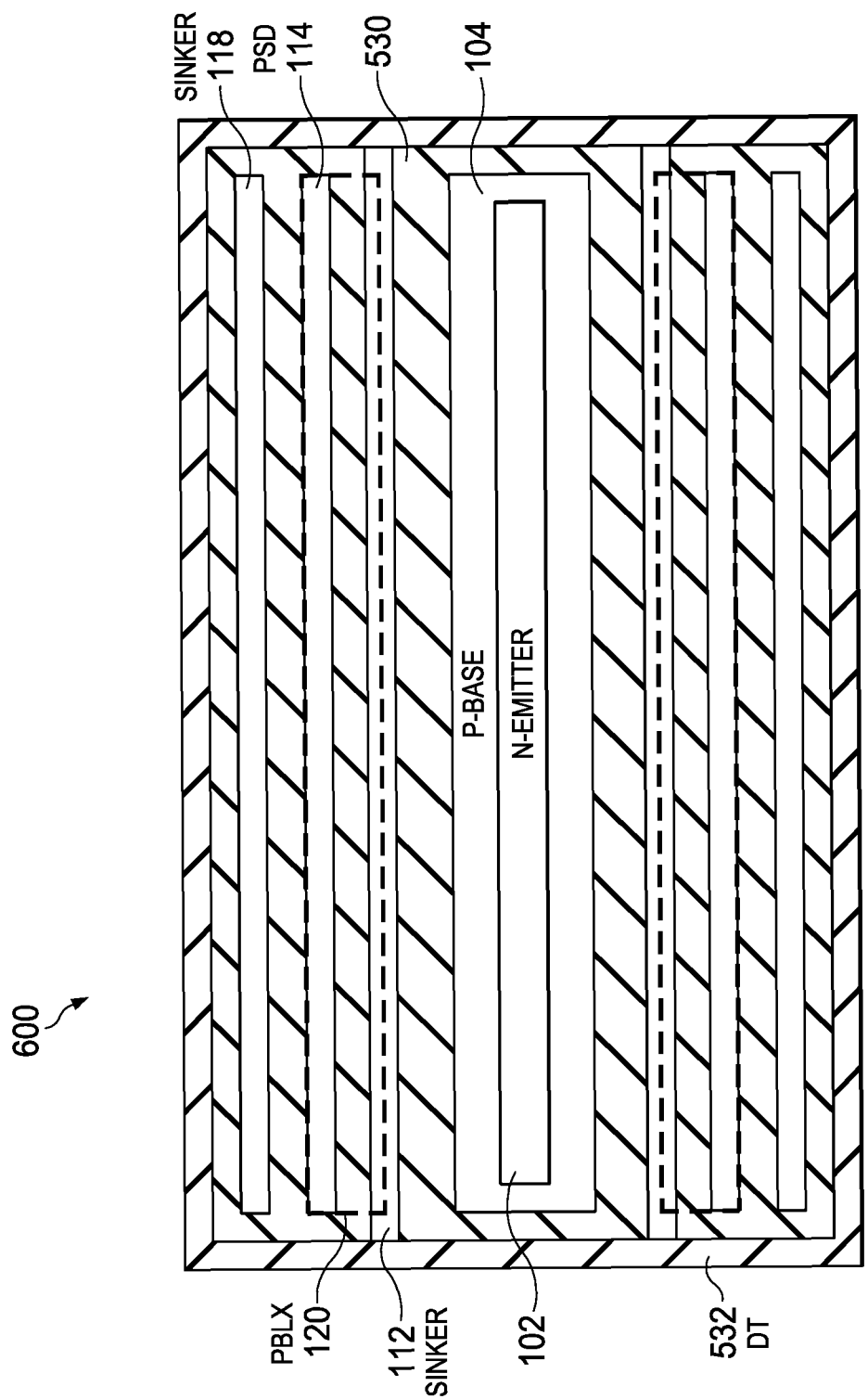
FIG. 6 depicts a plan view of the SCR of FIG. 1 according to an embodiment of the disclosure.
Figure 7:
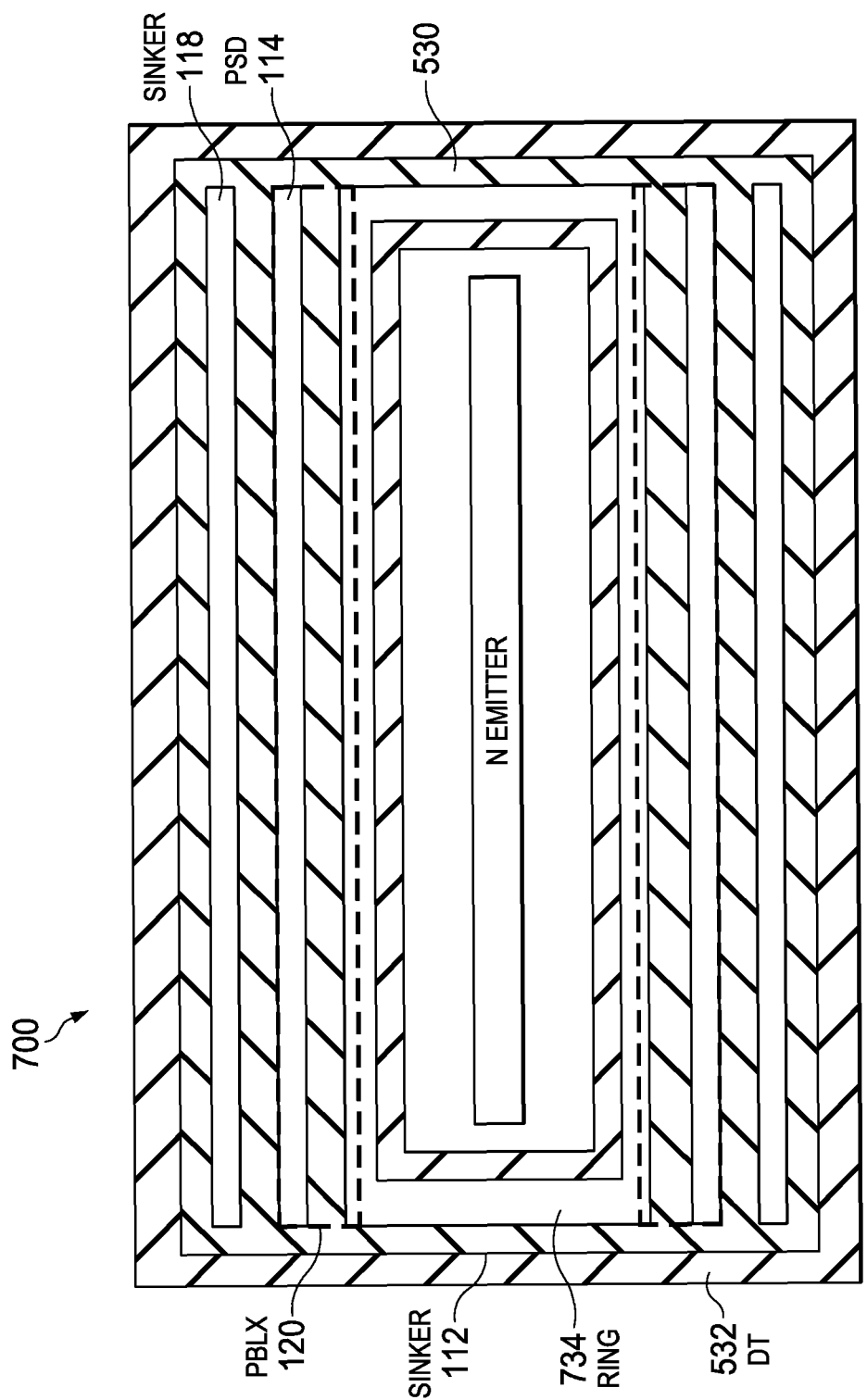
FIG. 7 depicts a plan view of the SCR of FIG. 1 according to an embodiment of the disclosure.
Figure 8:
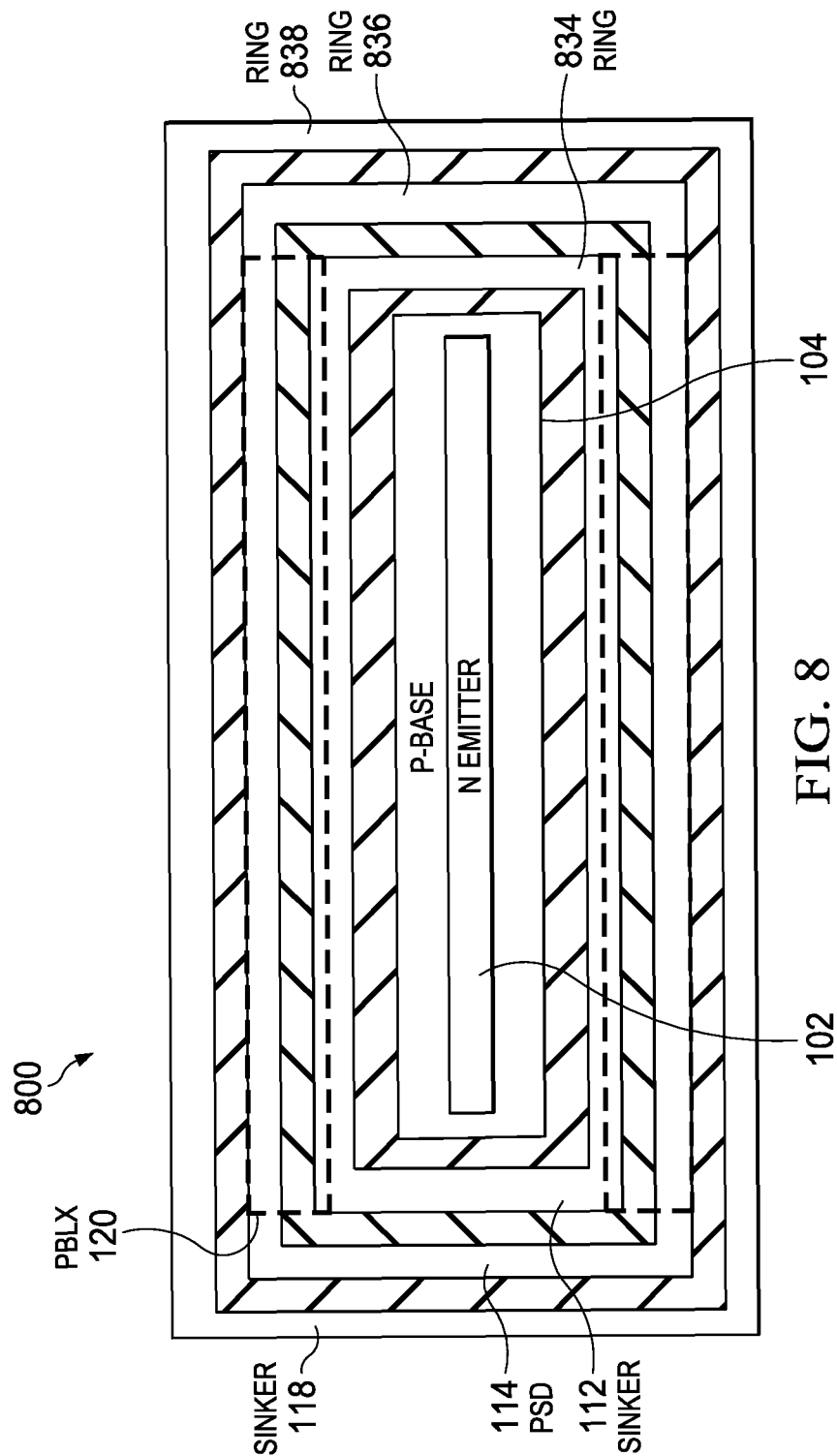
FIG. 8 depicts a plan view of the SCR of FIG. 1 according to an embodiment of the disclosure.

FIGS. 5-8 disclose plan views of the embodiment of FIG. 1, giving different ways in which the layout of this device can be implemented. It will be understood that these plan views are equally applicable to the embodiment of FIG. 3 in which the polarity of the dopants is reversed and with or without the switchable connection to the secondary sinker. FIG. 5 discloses a basic implementation, while each of FIGS. 6-8 provide ways in which punch-though can be improved near the edge of Deep Trench Isolation.

As seen in SCR 500, N-Emitter 102 and P-Base 104 are shown extending laterally in this drawing, with P-Base 104 extending beyond N-Emitter 102 in all four directions. Sinker 112, PSD 114 and Sinker 118 are laterally isolated from P-Base 104 and from each other by Shallow Trench Isolation 530, which laterally surrounds the entire SCR. PBLX 120, which provides the new anode junction, is shown as dotted lines. Additionally, Deep Trench Isolation 532, which is not shown in FIG. 1, isolates SCR 500 from the rest of the chip.

FIG. 6 discloses SCR 600, in which Sinker 112 is extended at each end so that Sinker 112 touches Deep Trench Isolation 532 to provide improved punch-through near the deep trench isolation. Other elements of the SCR are unchanged. FIG. 7 discloses SCR 700, in which the two segments of Sinker 112 are joined at each end to form Ring 734. Ring 734 laterally surrounds P-Base 104. Another modification is shown in FIG. 8, which discloses SCR 800 in which each of Sinker 112, PSD 114, and Sinker 118 is laterally extended at their ends to form respective Rings 834, 836, and 838 respectively. In this configuration, the deep trench is not needed to isolate the SCR from the substrate.

Other modifications to the circuit are also possible. Although a single Emitter "finger" 102 is shown overlying P-Base 104, multiple Emitter fingers 102 can be placed within P-Base 104; the same can be true when the dopant type is reversed, as in FIG. 3. In one embodiment, the entire SCR structure can be repeated multiple times within the deep trench isolation. Other variations will be obvious to one skilled in the art.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A bipolar semiconductor controlled rectifier (SCR) comprising:
    an emitter region having a first conductivity type and overlying a base region having a second conductivity type different from the first conductivity type;
    a collector region having the first conductivity type and lying under the base region, the collector region including a buried layer of the first conductivity type and a first conductivity type region;
    an anode region having the second conductivity type;
    a first sinker region having the first conductivity type and contacting the buried layer of the collector region, wherein the anode region is between the first sinker region and the base region; and
    a second sinker region having the first conductivity type and contacting the first conductivity type region of the collector region, the second sinker region lying between the anode region and the base region, wherein an extension of the anode region extends under a portion of the second sinker region between the second sinker region and the buried layer.

2. The bipolar SCR as recited in claim 1, further comprising a first metallization that connects the anode region and the first sinker region.

3. The bipolar SCR as recited in claim 2, further comprising a second metallization that contacts the second sinker region.

4. The bipolar SCR as recited in claim 2, further comprising a second metallization contacting the second sinker region, wherein the second metallization is switchably connected to the first metallization.

5. The bipolar SCR as recited in claim 2, further comprising shallow trench isolation that lies between the anode region and each of the first sinker region and the second sinker region.

6. The bipolar SCR as recited in claim 5, wherein the second sinker region extends laterally to encircle a region containing the emitter region and the base region, the anode region extends laterally to encircle the second sinker region and the first sinker region extends laterally to encircle the anode region.

7. The bipolar SCR as recited in claim 5, wherein the bipolar SCR is repeated multiple times within the deep trench isolation.

8. The bipolar SCR as recited in claim 5, wherein the bipolar semiconductor controlled rectifier is a silicon controlled rectifier.

9. The bipolar SCR as recited in claim 2, further comprising deep trench isolation that surrounds the bipolar SCR.

10. The bipolar SCR as recited in claim 9, wherein the shallow trench isolation separates the bipolar SCR from the deep trench isolation.

11. The bipolar SCR as recited in claim 10, wherein the shallow trench isolation separates the first sinker, the anode region and the base region from the deep trench isolation and the second sinker region contacts the deep trench isolation.

12. The bipolar SCR as recited in claim 9, wherein the shallow trench isolation separates the first sinker and the anode region from the deep trench isolation and the second sinker region extends laterally to encircle a region containing the emitter region and the base region.

13. The bipolar SCR as recited in claim 1, wherein the first conductivity type is n-type and the second conductivity type is p-type.

14. A bipolar semiconductor controlled rectifier (SCR) comprising:
- an emitter region having a first conductivity type and overlying a base region having a second conductivity type different from the first conductivity type;
- a collector region having the first conductivity type and lying under the base region;
- a first layer having the first conductivity type and lying under the collector region;
- a buried layer having the first conductivity type and lying under the first layer;
- an anode region having the second conductivity type and comprising a doped region of the second conductivity type, a well region of the second conductivity type and a first buried layer extension region of the second conductivity type, the first buried layer extension region contacting the first layer;
- a first sinker having the first conductivity type and comprising a first sinker region, a first well region, and a second buried layer extension region, wherein the anode region is between the first sinker region and the base region; and
- a second sinker having the first conductivity type and comprising a second sinker region, a second well region, and a third buried layer extension, wherein the first buried layer extension region of the anode region extends under a portion of the second sinker.

15. The bipolar SCR as recited in claim 14, wherein the first and second sinker regions have a dopant concentration of about $10^{20}/cm^3$.

16. The bipolar SCR as recited in claim 15 wherein the first well region has a dopant concentration between $5\times10^{18}/cm^3$ and $10^{19}/cm^3$ and the second anode region has a dopant concentration between $10^{18}/cm^3$ and $10^{19}/cm^3$.

17. The bipolar SCR as recited in claim 16, wherein the first buried layer extension region has a dopant concentration of $10^{18}/cm^3$ or greater and the second and third buried layer extension regions have a dopant concentration between $10^{18}/cm^3$ and $10^{19}/cm^3$.

18. The bipolar SCR as recited in claim 17 wherein the buried layer has a dopant concentration of about $10^{19}/cm^3$, the first layer has a dopant concentration between $5\times10^{15}/cm^3$ and $10^{17}/cm^3$, and the collector region has a dopant concentration of $10^{15}/cm^3$.

19. The bipolar SCR as recited in claim 18 wherein the emitter has a dopant concentration between $5\times10^{19}/cm^3$ and $10^{20}/cm^3$ and the base region has a dopant concentration of between $5\times10^{17}/cm^3$ and $10^{19}/cm^3$.

20. The bipolar SCR as recited in claim 19 wherein the first conductivity type is n-type and the second conductivity type is p-type.

* * * * *